United States Patent [19]
Uchida

[11] Patent Number: 5,804,988
[45] Date of Patent: Sep. 8, 1998

[54] LOGIC AND LEVEL CONVERSION CIRCUIT

[75] Inventor: Toshiya Uchida, Kawasaki, Japan

[73] Assignee: Fujitsu Limited, Kanagawa-ken, Japan

[21] Appl. No.: 626,608

[22] Filed: Apr. 2, 1996

[30] Foreign Application Priority Data

Jun. 20, 1995 [JP] Japan .................................. 7-153190

[51] Int. Cl.$^6$ .......................................... H03K 19/0185
[52] U.S. Cl. .................................. 326/81; 326/83
[58] Field of Search .......................... 326/63, 71, 80–81, 326/83, 86

[56] References Cited

U.S. PATENT DOCUMENTS

| | | | |
|---|---|---|---|
| 4,677,317 | 6/1987 | Sakuma | 326/81 |
| 5,113,097 | 5/1992 | Lee | 326/81 |
| 5,136,190 | 8/1992 | Chern et al. | 326/81 |
| 5,151,619 | 9/1992 | Austin et al. | 326/86 |
| 5,406,140 | 4/1995 | Wert et al. | 326/86 X |
| 5,418,474 | 5/1995 | Davis et al. | 326/81 X |
| 5,451,889 | 9/1995 | Heim et al. | 326/81 |

*Primary Examiner*—David R. Hudspeth
*Attorney, Agent, or Firm*—Staas & Halsey

[57] ABSTRACT

Invertors 23 and 24 operating under a low source voltage receive a reset signal Vr and an input signal Va respectively. Outputs of invertors 23 and 24 are connected to gates of a pMOS transistor 3 and an nMOS transistor 54 respectively, which operate under a high source voltage. The pMOS transistor 3 and the nMOS transistor 54 are connected in series, operating under a high source voltage. The pMOS transistor 3 has a threshold voltage which is approximately equal to the low source voltage.

8 Claims, 6 Drawing Sheets

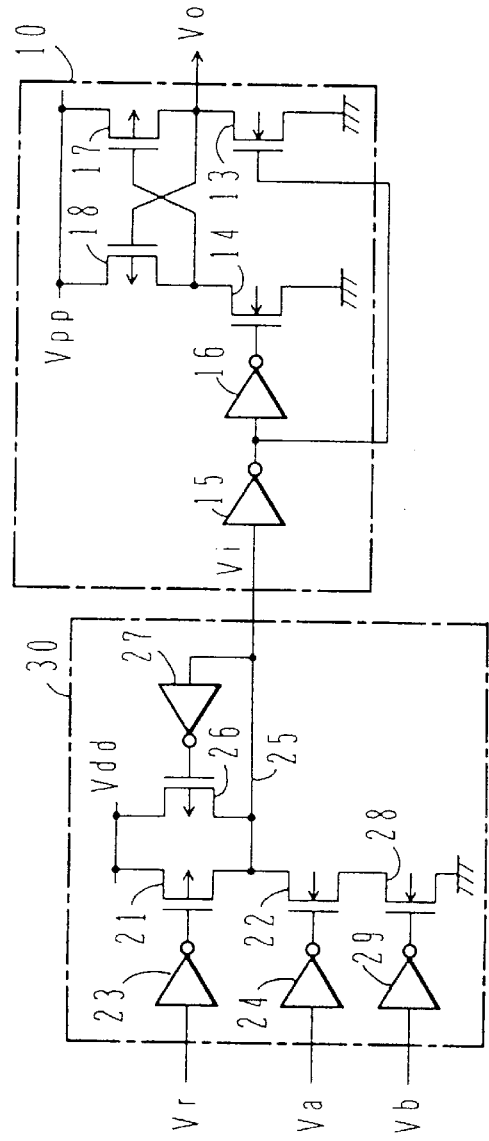
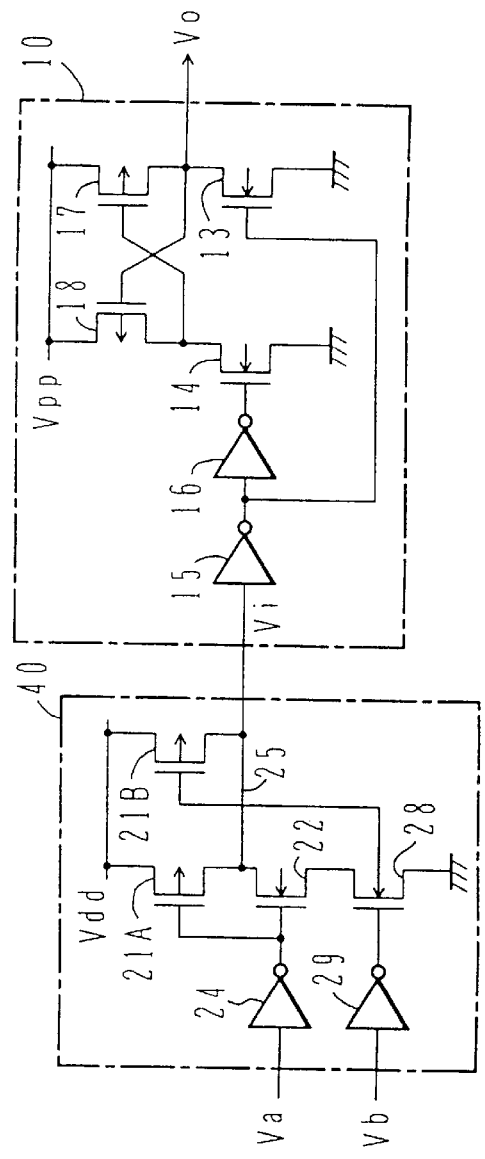
FIG.6A PRIOR ART
FIG.6B PRIOR ART

LOGIC AND LEVEL CONVERSION CIRCUIT

BACKGROUND OF THE INVENTION

1. Field of the Invention

The present invention relates to a logic & level conversion circuit which combines a logic circuit and a level conversion circuit that converts the logic level of a low source voltage to the logic level of a high source voltage and a semiconductor device that includes this logic & level conversion circuit.

2. Description of the Related Art

In the trend for higher integration of semiconductor integrated circuits, circuit elements are becoming more miniaturized and in order to assure the reliability of circuit elements thus miniaturized and also in order to achieve lower power consumption, the source voltage is reduced. However, reducing the voltage is detrimental to achieving higher speed operation. In addition, in a semiconductor memory device, for instance, since the voltage is reduced when an electrical charge travels through the transfer gate between the bit line and the memory cells, it is not possible to attain sufficient electrical charge for the write in the memory cells when the voltage is lowered. Thus, higher speed operation, which is an advantage of high voltage, and achievement of reliability of the circuit elements and reduction of power consumption, which are the advantages of low voltage, are both achieved by providing a step-up circuit within the semiconductor integrated circuit and by using a high voltage only where it is necessary.

The circuits shown in FIGS. 5A, 5B, 6A and 6B are employed in such a semiconductor integrated circuit.

The level conversion circuit 10, shown in FIG. 5A, comprises a first logic circuit 11 that operates under a voltage of, for instance, 3.3V between a first power supply line Vdd and a ground line and a second logic circuit 12 that operates under a voltage of, for instance, 5.0 V between a second power supply line Vpp whose potential is higher than that of the first power supply line Vdd and the ground line. Although nMOS transistors 13 and 14 of the second logic circuit 12 can be turned ON/OFF with the output from the first logic circuit 11, pMOS transistors 17 and 18 of the second logic circuit 12 cannot be completely turned OFF with the high level output from the first logic circuit 11 and, as a result, a through current runs.

Thus, in this logic & level conversion circuit 10, when the nMOS transistor 13 is ON and the and the nMOS transistor 14 is OFF with the potential Vi at low, the pMOS transistor 18 is turned ON by supplying the low potential from the drain of the nMOS transistor 13 to the gate of the pMOS transistor 18, the pMOS transistor 17 is turned OFF by supplying the high potential from the drain of the pMOS transistor 14 to the gate of the pMOS transistor 17, to set the potential Vo at low. When the potential Vi is at high, the ON/OFF of the nMOS transistors 13 and 14 and the pMOS transistors 17 and 18 are reversed from the above to set the potential Vo to high.

The level conversion circuit shown in FIG. 5B includes a dynamic operation type buffer circuit 20 connected to the input of the level conversion circuit 10. A signal obtained by inverting a reset signal Vr with an invertor 23 and a signal obtained by inverting an input signal Va with an invertor 24 are provided to the gates of a pMOS transistor 21 and an nMOS transistor 22 respectively.

During a standby state, the reset signal Vr and the input signal Va are at high, the pMOS transistor 21 set to ON and the nMOS transistor 22 set to OFF, and a signal line 25 is pre-charged with its potential Vi at high.

When the standby state shifts to the active state, the reset signal Vr shifts to low and the pMOS transistor 21 is turned OFF. In order to prevent the potential Vi being reduced due to leakage of the electrical charge on the signal line 25 in this state, a pMOS transistor 26 is connected between the first power supply line Vdd and the signal line 25 and a signal that is obtained by inverting the potential Vi with an invertor 27 is provided to the gate of the pMOS transistor 26.

When the input signal Va is set to low, the nMOS transistor 22 is turned ON and the electrical charge on the signal line 25 is discharged toward the ground line to set the potential Vi to low. At this time, a through current runs from the pMOS transistor 26 to the nMOS transistor 22 and in order to minimize this through current, the pMOS transistor 26 having high ON resistance is used.

The negative logic AND & level conversion circuit shown in FIG. 6A includes a dynamic operation type AND circuit 30 connected to the input of the level conversion circuit 10. The AND circuit 30 is constituted by adding an nMOS transistor 28 and an invertor 29 to the buffer circuit 20 shown in FIG. 5B. The electrical charge that has been pre-charged on the signal line 25 is discharged toward the ground line via the nMOS transistors 22 and 28 only when both the input signals Va and Vb are set to low.

The negative logic AND & level conversion circuit shown in FIG. 6B includes a static operation type AND circuit 40 connected to the input of the level conversion circuit 10. In the AND circuit 40, when the input signals Va and Vb are both at low level, the nMOS transistors 22 and 28 are turned ON and the pMOS transistors 21A and 21B are turned OFF, to set the potential Vi of the signal line 25 to low. Otherwise, the potential Vi is set to high with the pMOS transistor 21A or 21B being ON.

The circuits shown in FIGS. 5B, 6A and 6B all have high numbers of circuit elements and therefore, they prevent higher integration. In addition, since the number of stages of gates from the input to the output is high, the signal propagation delay time is lengthened.

SUMMARY OF THE INVENTION

Accordingly, an object of the present invention is to provide a logic & level conversion circuit with a reduced number of stages of gates and a simple structure.

FIG. 1 shows the principle structure of the present invention.

According to the present invention, there is provided a logic & level conversion circuit comprising: a first logic circuit operating under a first voltage between a first potential supply line and a reference potential supply line, the first logic circuit providing a first output signal and a second output signal; and a second logic circuit operating under a second voltage between a second potential supply line and a reference potential supply line, the second voltage being higher than the first voltage, the second logic circuit receiving the first output signal and the second output signal, the second logic circuit having a output signal line; wherein the second logic circuit includes: a pMIS transistor having a source connected to the second potential supply line, a gate receiving the first output signal and a drain connected to the output signal line; and an nMIS circuit connected between the output signal line and the reference signal line, the nMIS circuit receiving the second output signal.

In FIG. 1, reference number 5 indicates a step-up circuit which steps up a potential Vdd of the first potential supply line to generate a potential Vpp of the second potential supply line. This may be either an internal circuit or an external circuit.

In the present invention, the potential Vo of the output signal line is set to high when the pMIS transistor 3 is turned ON and the nMIS circuit 4 is turned OFF by the first logic circuit 1, and the potential Vo of the output signal line is set to low when the pMIS transistor 3 is turned almost OFF and the nMIS circuit 4 is turned ON by the first logic circuit 1.

Since the gate of the pMIS transistor receives the first output signal from the first logic circuit 1, whose source voltage Vdd is lower than that Vpp of the second logic circuit 2, a level conversion circuit 12 as shown in FIG. 5A is not required and an advantage is achieved in that the structure is simplified with the number of stages of gates reduced.

In the 1st mode of the present invention, the pMIS transistor has a threshold voltage which is approximately either equal to or slightly lower than the voltage between the first and second voltages.

In the first mode, it is possible to satisfy the following requirements: after the pMIS transistor 3 is turned ON and the nMIS circuit 4 is turned OFF to pre-charge the output signal line, in a state in which the pMIS transistor 3 is turned almost OFF, an appropriate amount of electrical charge replenishment is performed against the leakage of the electrical charge on the output signal line and the through current is minimized when the nMIS circuit 4 is turned ON the next time.

In the 2nd mode of the present invention, the nMIS circuit is an nMIS transistor; and the first logic circuit includes: a first invertor providing the first output signal to the gate of the pMIS transistor; and a second invertor providing the second output signal to a gate of the nMIS transistor.

In the second mode, functions that are identical to those achieved by the prior art level conversion circuit shown in FIG. 5B are achieved with a simple structure with a reduced number of circuit elements. In addition, since the number of gate stages from the input to the output is small, at only two, the signal propagation delay time is reduced. Furthermore, since the cross-connection feedback operation as in the level conversion circuit 10 shown in FIG. 5B is eliminated, the operation is speeded up.

In the 3rd mode of the present invention, the nMIS circuit includes: a first nMIS transistor; and a second nMIS transistor connected to the first nMIS transistor in series; and the first logic circuit includes: a first invertor providing the first output signal to the gate of the pMIS transistor; a second invertor providing the second output signal to a gate of the first nMIS transistor; a third invertor providing a third output signal to a gate of the second nMIS transistor.

In the third mode, when both the inputs of the second and third invertors are at low level with the output signal line pre-charged and the pMIS transistor turned almost OFF, the first and second nMIS transistors are turned ON and the electrical charge on the output signal line is discharged toward the reference potential line to set the potential of the output signal line to low.

If the second input signal of the second invertor is set to low before the third input signal of the third invertor shifts to low, the pre-charged electrical charge on the output signal line runs toward the second nMIS transistor due to the capacity component of the second nMIS transistor, and a portion of it leaks. Thus, if the pMIS transistor is completely turned OFF, the potential of the output signal line is reduced, as indicated with the alternate long and short line in FIG. 3B.

However, since the pMIS transistor is actually turned almost OFF, the electrical charge is replenished on the output signal line and its potential is held at a constant level. In this case, since the second nMIS transistor is OFF, any through current there is can be disregarded.

Consequently, in the third mode, functions that are identical to those achieved in the prior art circuit shown in FIG. 6A are achieved with a simple structure with the number of circuit elements reduced. In addition, since the number of stages of gates from the input to the output is low, at two, the signal propagation delay time is reduced. Furthermore, since the cross-connection feedback operation, as in the level conversion circuit 10 shown in FIG. 6A is eliminated, the operation is speeded up.

In the 4th mode of the present invention, the nMIS circuit includes: a first nMIS transistor; and a second nMIS transistor connected to the first nMIS transistor in series; the pMIS circuit includes: a first PMIS transistor; and a second pMIS transistor connected to the first pMIS transistor in parallel; and the first logic circuit includes: a first invertor providing the first output signal to gates of the first pMIS transistor and the first nMIS transistor; and a second invertor providing the second output signal to gates of the second pMIS transistor and the second nMIS transistor.

Although the logic & level conversion circuit in the third or fourth mode described above has an advantage in that their structure is simple, they has a disadvantage in that, under conditions in which the first nMIS transistor and the second nMIS transistor are ON and the pMIS transistor 3 or 3A and 3B are almost OFF, a slight through current flows. However, when one of these logic & level conversion circuits is employed in an address decoder, the occurrence of these conditions together is extremely rare and, consequently, on the whole, the through current is very small. As a result, this disadvantage in the logic & level conversion circuit is minimized to the extent that it can be ignored. Meanwhile, the advantage of these logic & level conversion circuits, i.e., the simple structure, is maintained and, therefore, the semiconductor memory device provided with an address decoder structured as described thus far provides outstanding performance in practical use.

The logic & level conversion circuit may be in a semiconductor integrated circuit.

BRIEF DESCRIPTION OF THE DRAWINGS

FIGS. 6A and 6B show the circuit diagrams of AND level conversion circuits in the prior art.

DESCRIPTION OF THE PREFERRED EMBODIMENTS

Figure 1:
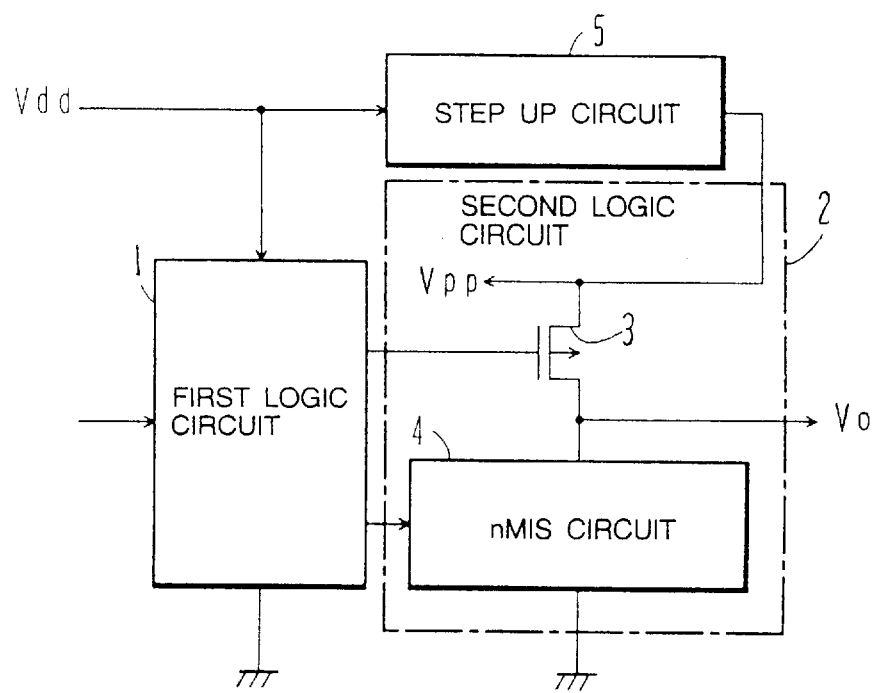
FIG. 1 shows the principal structure of a logic & level conversion circuit according to the present invention.

The preferred embodiments of the present invention are understood by referring to the drawings, like numerals being used for like and corresponding parts of the various drawings.

1. First Embodiment

Figure 2A:
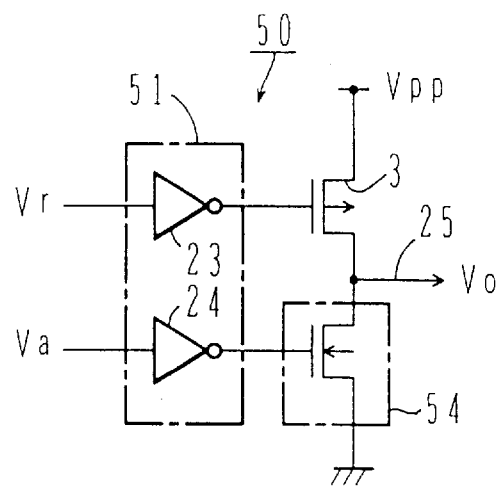
FIG. 2A shows a circuit diagram of a level conversion circuit in the first embodiment according to the present invention and FIG. 2B shows a timing chart of this circuit.

FIG. 2A shows a dynamic operation type level conversion circuit 50 in a semiconductor integrated circuit. The circuit is a first embodiment of the logic & level conversion circuit according to the present invention. A first logic circuit 51 and an nMOS transistor 54 are examples of the first logic circuit 1 and the nMIS circuit 4 in FIG. 1 respectively.

The first logic circuit 51 operates under a source voltage of, for instance, 3.3V between a first power supply line Vdd and the ground line.

The first logic circuit 51 comprises an invertor 23 and an invertor 24 with the outputs of the invertors 23 and 24 connected to the gates of a pMOS transistor 3 and an nMOS transistor 54 respectively. A reset signal Vr and an input signal Va are provided to the inputs of the invertors 23 and 24 respectively. The source of the pMOS transistor 3 is connected to a second power supply line Vpp with its drain connected to a signal line 25. The potential of the second power supply line Vpp is higher than that of the first power supply line Vdd at, for instance, 5.0V. The nMOS transistor 54 is connected between the signal line 25 and the ground line.

Figure 2B:
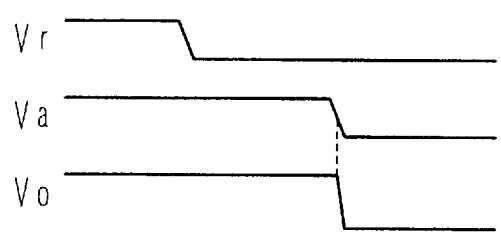

FIG. 2B is a timing chart illustrating the operation of the level conversion circuit 50.

In a standby state, the reset signal Vr and the input signal Va are at high, the pMOS transistor 3 is ON, the nMOS transistor 54 is OFF and the signal line 25 is pre-charged at high potential Vo.

When the standby state shifts to an active state, the reset signal Vr shifts to low and the pMOS transistor 3 is turned almost OFF. Even if the electrical charge on the signal line 25 leaks, electrical charge is replenished on to the signal line 25 from the second power supply line Vpp via the pMOS transistor 3 and, thus, a reduction of the potential Vo is prevented.

When the input signal Va is set to low, the nMOS transistor 54 is turned ON and the electrical charge on the signal line 25 is discharged toward the ground line to set the potential Vo to low. Since the pMOS transistor 3 is almost OFF, a slight through current runs from the pMOS transistor 3 to the nMOS transistor 54.

The characteristics of the pMOS transistor 3 are determined in such a manner that the requirement that the replenishment of electrical charge mentioned above is performed as necessary and that the through current mentioned above is minimized. These requirements, although dependent upon the difference between the potentials Vpp and Vdd, the capacitance of the signal line 25 and the degree of charge leakage, are normally satisfied by determining the design parameters of (gate width)/(gate length) in such a manner that the threshold potential of the pMOS transistor 3 is either equal to the potential Vdd or slightly lower than the potential Vdd, in other words, that the threshold voltage of the pMOS transistor 3 is either equal to, or slightly lower than, the voltage between the potentials Vdd and Vpp.

Figure 5A:
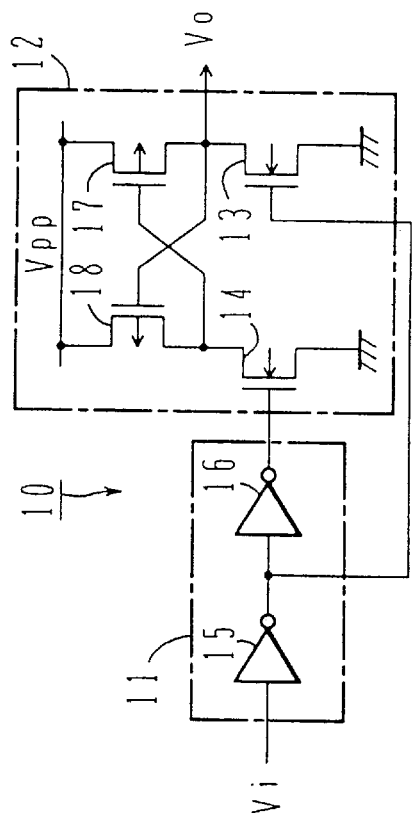
FIGS. 5A and 5B show circuit diagrams of level conversion circuits in the prior art.
Figure 5B:
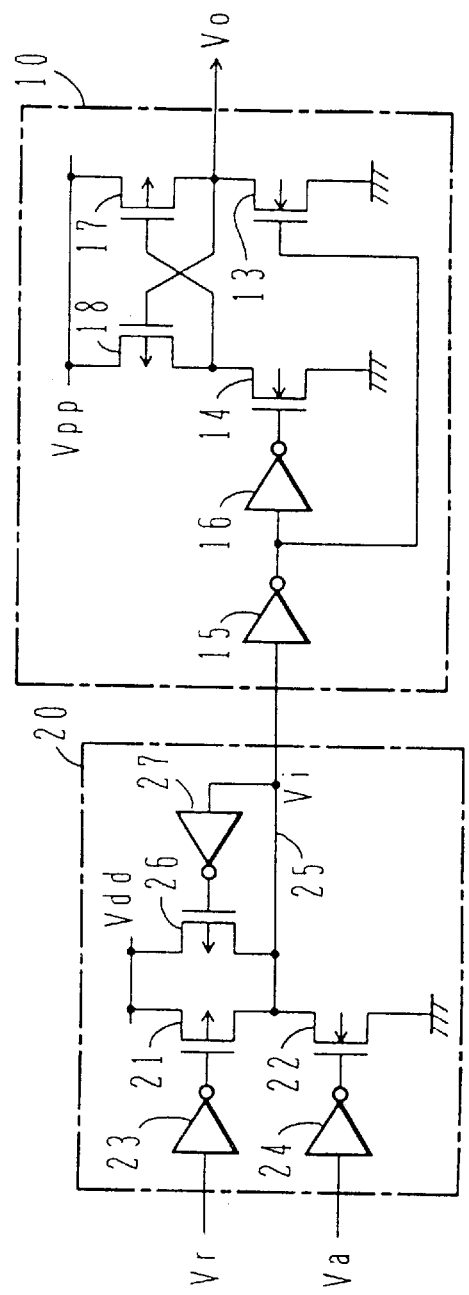

As long as the characteristics of the pMOS transistor 3 are determined in this manner, the level conversion circuit 50 fulfills the same functions as those of the prior art circuit shown in FIG. 5B.

Since the number of circuit elements employed in the level conversion circuit 50 is obviously smaller than that in the prior art circuit, resulting in a simpler structure and the number of stages of gates from the input to the output is small, at 2, the signal propagation delay time is reduced. In addition, while the operation is slowed down in the level conversion circuit 10 in FIG. 5B due to the cross-connection feedback, such feedback is eliminated in the level conversion circuit 50, speeding up the operation.

2. Second Embodiment

Figure 3A:
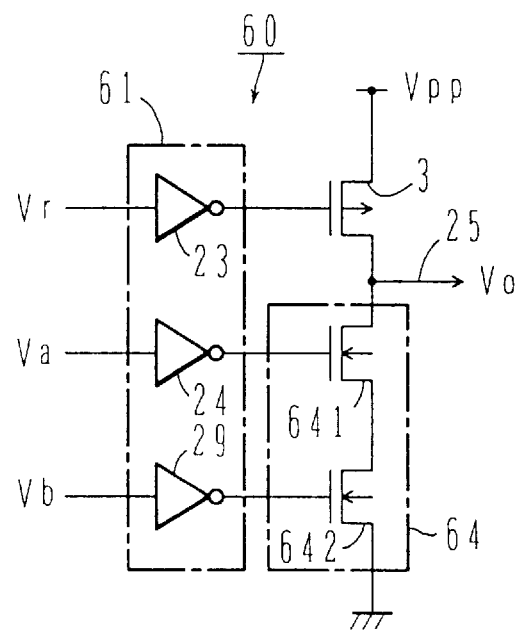
FIG. 3A shows a circuit diagram of a AND & level conversion circuit in the second embodiment according to the present invention and FIG. 3B shows a timing chart of this circuit.

FIG. 3A shows a negative logic dynamic operation type AND & level conversion circuit 60 which is a second embodiment of the logic & level conversion circuit according to the present invention. A first logic circuit 61 and an nMOS circuit 64 are examples of the first logic circuit 1 and the nMIS circuit 4 in FIG. 1 respectively.

In the nMOS circuit 64, an nMOS transistor 641 and an nMOS transistor 642 are connected in series between the signal line 25 and the ground line. The outputs of invertors 24 and 29 of the first logic circuit 61 are connected to the gates of the nMOS transistors 641 and 642 respectively. The other structural features are identical to those in the level conversion circuit 50 shown in FIG. 2A.

Figure 3B:
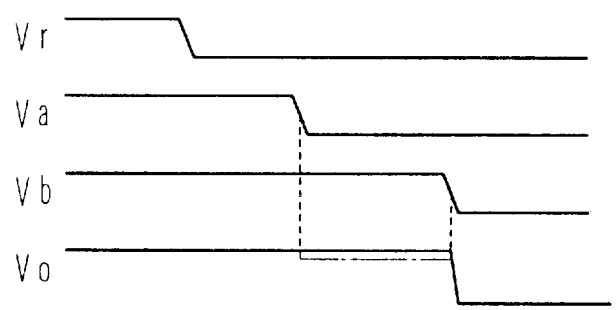

FIG. 3B is a timing chart illustrating the operation of the AND & level conversion circuit 60.

When both the input signals Va and Vb are set to low in a state in which the signal line 25 has been pre-charged and the pMOS transistor 3 is almost OFF, the NMOS transistors 641 and 642 are turned ON and the electrical charge on the signal line 25 is discharged toward the ground line, to set the potential Vo to low.

If the input signal Va is set to low before the input signal Vb shifts to low, the pre-charged electrical charge on the signal line 25 flows toward the nMOS transistor 641 due to the capacity component of the nMOS transistor 641 and a portion of it leaks. Thus, if the pMOS transistor 3 is completely OFF, the potential Vo is reduced, as indicated with the alternate long and short line in FIG. 3B. However, since the pMOS transistor 3 is almost OFF, electrical charge is replenished on the signal line 25, maintaining the potential Vo at a constant level. In this case, since the nMOS transistor 642 is OFF, the through current can be disregarded.

Consequently, the AND & level conversion circuit 60 fulfills the same function as those in the prior art circuit shown in FIG. 6A.

Since the number of circuit elements employed in the AND & level conversion circuit 60 is obviously smaller than that in the prior art circuit, resulting in a simpler structure and the number of gate stages from the input to the output is low, at two, the signal propagation delay time is reduced. In addition, while the operation in the level conversion circuit 10 in FIG. 6A is slowed down due to the cross-connection feedback, such feedback is eliminated in the AND & level conversion circuit 60, speeding up the operation.

3. Third Embodiment

Figure 4A:
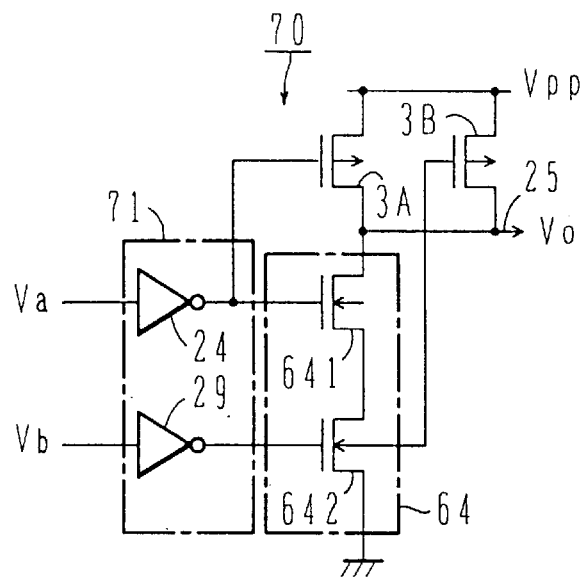
FIG. 4A shows a circuit diagram of a AND & level conversion circuit of the third embodiment according to the present invention and FIG. 4B shows an address decoder employing this AND & level conversion circuit.

FIG. 4A shows a negative logic static operation type AND & level conversion circuit 70 which is a third embodiment of the logic & level conversion circuit according to the present invention. A first logic circuit 71 and an nMOS circuit 64 are examples of the first logic circuit I and the NMIS circuit 4 in FIG. 1 respectively. In this AND & level conversion circuit 70, a pMOS transistor 3A and a pMOS transistor 3B are connected in parallel.

The first logic circuit 71 comprises an invertor 24 and an invertor 29, with the output of the invertor 24 connected to the gate of the pMOS transistor 3A and the gate of nMOS transistor 641, and the output of the invertor 29 connected to the gate of the pMOS transistor 3B and the gate of nMOS transistor 642.

In the AND & level conversion circuit 70, when both the input signals Va and Vb are at low, the nMOS transistors 641 and 642 are turned ON and the pMOS transistors 3A and 3B are turned almost OFF to set the potential Vo of the signal line 25 to low. Otherwise, the potential Vo is set to high with the pMOS transistor 3A or the pMOS transistor 3B being OFF.

Since this circuit is a static operation type, it is desirable to minimize the electrical current running when the pMOS transistor 3A or the pMOS transistor 3B is almost OFF.

Figure 4B:
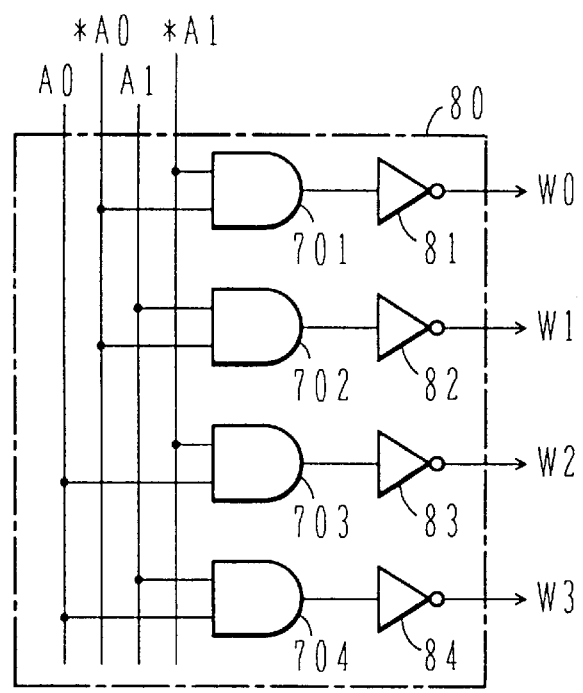

FIG. 4B shows an address decoder 80. In the figure, * indicates an inversion of a logic value. Since word lines W0 to W3 are relatively long with relatively large capacitance, it is necessary to set the high level potential higher than that of the first power supply line Vdd in order to achieve high speed operation. To achieve this, the address decoder 80 employs AND & level conversion circuits 701 to 704 that are structured identically to the logic & level conversion circuit 70. Since the AND & level conversion circuits 701 to 704 are negative logic, invertors 81 to 84 are connected to their respective outputs. The invertors 81 to 84 are CMOS invertors which use the second power supply line Vpp. The word lines W0 to W3 are connected to the outputs of the invertors 81 to 84 respectively.

Since each of the word lines W0 to W3 approximately achieves the potential Vpp when it is at high level, high speed operation is possible.

Although the AND & level conversion circuit 70 provides an advantage in that its structure is simpler compared to that of the prior art circuit shown in FIG. 6B, it provides a disadvantage in that a slight through current runs when the nMOS transistors 641 and 642 are ON and the pMOS transistors 3A and 3B are almost OFF. However, when the AND & level conversion circuit 70 is adopted in the address decoder 80, since a through current runs only in one of the AND & level conversion circuits 701 to 704, the overall through current is slight, reducing the disadvantage of the AND & level conversion circuit 70 described above to the extent that it can be disregarded. In the meantime, since the advantages of the logic & level conversion circuit 70 explained above are retained, the address decoder 80 structured in this manner provides outstanding performance from the point of view of practical use. This advantage is further enhanced and the disadvantage further reduced as the number of address input bits in the address decoder 80 increases.

Although preferred embodiments of the invention have been described in detail, it should be understood that various changes, substitutions and alterations can be made therein without departing from the spirit and scope of the invention as defined by the appended claims.

For instance, the advantages described above are also achieved by employing the AND & level conversion circuit 60 shown in FIG. 3A for the AND & level conversion circuits 701 to 704 in FIG. 4B. In addition, a variety of logic circuits are conceivable for nMIS circuit 4 in FIG. 1.

What is claimed is:

1. A logic & level conversion circuit comprising:
    a first logic circuit operating under a first potential between a first potential supply line and a reference potential supply line, said first logic circuit providing a first output signal and a second output signal, and
    a second logic circuit operating under a second potential between a second potential supply line and a reference potential supply line, said second potential being higher than said first potential, said second logic circuit receiving said first output signal and said second output signal, said second logic circuit having an output signal line;
    wherein said second logic circuit includes
        a pMIS transistor having a source connected to said second potential supply line, a gate receiving said first output signal and a drain connected to said output signal line, and having a threshold potential which is approximately equal to said first potential; and
        an nMIS circuit connected between said output signal line and said reference signal line, said nMIS circuit receiving said second output signal.

2. A logic & level conversion circuit according to claim 1, wherein:
    said nMIS circuit is an nMIS transistor; and
    said first logic circuit includes:
        a first invertor providing said first output signal to said gate of said pMIS transistor; and
        a second invertor providing said second output signal to a gate of said nMIS transistor.

3. A logic & level conversion circuit according to claim 1, wherein:
    said nMIS circuit includes:
        a first nMIS transistor; and
        a second nMIS transistor connected to said first nMIS transistor in series; and
    said first logic circuit includes:
        a first invertor providing said first output signal to said gate of said pMIS transistor;
        a second invertor providing said second output signal to a gate of said first nMIS transistor;
        a third invertor providing a third output signal to a gate of said second nMIS transistor.

4. A logic & level conversion circuit according to claim 1, wherein:
    said nMIS circuit includes:
        a first nMIS transistor; and
        a second nMIS transistor connected to said first nMIS transistor in series;
    said pMIS circuit includes:
        a first pMIS transistor; and
        a second pMIS transistor connected to said first pMIS transistor in parallel; and
    said first logic circuit includes:
        a first invertor providing said first output signal to gates of said first pMIS transistor and said first nMIS transistor; and
        a second invertor providing said second output signal to gates of said second pMIS transistor and said second nMIS transistor.

5. A semiconductor integrated circuit provided with a logic & level conversion circuit, said logic & level conversion circuit comprising:
    a first logic circuit operating under a first potential between a first potential supply line and a reference potential supply line, said first logic circuit providing a first output signal and a second output signal; and
    a second logic circuit operating under a second potential between a second potential supply line and a reference potential supply line, said second potential being higher than said first potential, said second logic circuit receiving said first output signal and said second output signal, said second logic circuit having an output signal line;
    wherein said second logic circuit includes:
        a pMIS transistor having a source connected to said second potential supply line, a gate receiving said first output signal and a drain connected to said output signal line, and having a threshold potential which is approximately equal to said first potential; and an nMIS circuit connected between said output signal line and said reference signal line, said nMIS circuit receiving said second output signal.

6. A semiconductor integrated circuit according to claim 5, wherein:

said nMIS circuit is an nMIS transistor; and said first logic circuit includes:

a first invertor providing said first output signal to said gate of said pMIS transistor; and a second invertor providing said second output signal to a gate of said nMIS transistor.

7. A semiconductor integrated circuit according to claim 5, wherein:

said nMIS circuit includes:

a first nMIS transistor; and a second nMIS transistor connected to said first nMIS transistor in series; and said first logic circuit includes:

a first invertor providing said first output signal to said gate of said pMIS transistor;

a second invertor providing said second output signal to a gate of said first nMIS transistor;

a third invertor providing a third output signal to a gate of said second nMIS transistor.

8. A semiconductor integrated circuit according to claim 5, wherein:

said nMIS circuit includes:

a first nMIS transistor; and a second nMIS transistor connected to said first nMIS transistor in series;

said pMIS circuit includes:

a first pMIS transistor; and a second pMIS transistor connected to said first pMIS transistor in parallel; and said first logic circuit includes:

a first invertor providing said first output signal to gates of said first pMIS transistor and said first nMIS transistor; and a second invertor providing said second output signal to gates of said second pMIS transistor and said second nMIS transistor.

* * * * *